United States Patent
Mashima et al.

(10) Patent No.: US 7,319,295 B2
(45) Date of Patent: Jan. 15, 2008

(54) HIGH-FREQUENCY POWER SUPPLY STRUCTURE AND PLASMA CVD DEVICE USING THE SAME

(75) Inventors: Hiroshi Mashima, Nagasaki-ken (JP); Keisuke Kawamura, Nagasaki-ken (JP); Akemi Takano, Nagasaki-ken (JP); Yoshiaki Takeuchi, Nagasaki-ken (JP); Tetsuro Shigemizu, Nagasaki-ken (JP); Tatsufumi Aoi, Hiroshima-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/506,544

(22) PCT Filed: Mar. 13, 2003

(86) PCT No.: PCT/JP03/02986

§ 371 (c)(1),
(2), (4) Date: Jan. 14, 2005

(87) PCT Pub. No.: WO03/077293

PCT Pub. Date: Sep. 18, 2003

(65) Prior Publication Data

US 2005/0127844 A1  Jun. 16, 2005

(30) Foreign Application Priority Data

Mar. 14, 2002 (JP) .............................. 2002-070181

(51) Int. Cl.
*H01J 7/24* (2006.01)

(52) U.S. Cl. ............................. 315/111.21; 315/111.41; 315/111.51; 118/723 I; 156/345.35

(58) Field of Classification Search ........... 315/111.21, 315/111.41, 111.51; 118/723 E, 723 I; 156/345.35, 156/345.45, 345.47
See application file for complete search history.

(56) References Cited

U.S. PATENT DOCUMENTS 3,855,095 A * 12/1974 Leonard et al. ............. 204/420

(Continued)

FOREIGN PATENT DOCUMENTS

JP  4-236781  8/1992

(Continued)

*Primary Examiner*—Haissa Philogene
*Assistant Examiner*—Tung X Le
(74) *Attorney, Agent, or Firm*—Oblon, Spivak, McClelland, Maier & Neustadt, P.C.

(57) ABSTRACT

A radio frequency power supply structure and a plasma CVD device comprising the same are provided in which reflection of radio frequency power at a connecting portion where an RF cable connects to an electrode is reduced so that incidence of the radio frequency power into the electrode increases. In the radio frequency power supply structure for use in a device generating plasma by charging a plate-like electrode with a radio frequency power, the radio frequency power supply structure supplying the electrode with the radio frequency power from an RF cable, the RF cable is positioned on an extended plane of a plane formed by the electrode to connect to the electrode at a connecting portion provided on an end peripheral portion of the electrode. The RF cable connects to the electrode substantially in the same plane as the plane formed by the electrode. Voltage acting after the connecting portion becomes symmetric relative to the plane formed by the electrode and the electric line of force also becomes symmetric. Thereby, change of impedance at the connecting portion is reduced, reflection of the radio frequency power at the connecting portion is reduced, incidence of the radio frequency power into the electrode increases and the efficiency of film forming and surface treatment is enhanced.

6 Claims, 6 Drawing Sheets

U.S. PATENT DOCUMENTS

| | | | |
|---|---|---|---|
| 4,381,965 A * | 5/1983 | Maher et al. | 156/345.45 |
| 5,061,359 A * | 10/1991 | Babu et al. | 204/298.07 |
| 5,079,481 A * | 1/1992 | Moslehi | 315/111.21 |
| 5,261,962 A * | 11/1993 | Hamamoto et al. | 118/723 I |
| 5,534,751 A * | 7/1996 | Lenz et al. | 315/111.71 |
| 5,543,688 A * | 8/1996 | Morita | 315/111.21 |
| 6,028,395 A * | 2/2000 | Holland et al. | 315/111.51 |
| 6,286,995 B1 * | 9/2001 | Takahashi et al. | 374/148 |
| 6,305,316 B1 * | 10/2001 | DiVergilio et al. | 118/723 I |
| 6,313,584 B1 * | 11/2001 | Johnson et al. | 315/111.21 |
| 6,353,201 B1 * | 3/2002 | Yamakoshi et al. | 219/121.52 |
| 6,432,260 B1 * | 8/2002 | Mahoney et al. | 156/345.35 |
| 6,677,711 B2 * | 1/2004 | MacGearailt | 315/111.21 |
| 6,900,596 B2 * | 5/2005 | Yang et al. | 315/111.21 |
| 2001/0021422 A1 * | 9/2001 | Yamakoshi et al. | 427/569 |
| 2002/0038631 A1 * | 4/2002 | Sumiya et al. | 118/723 E |
| 2002/0129902 A1 * | 9/2002 | Babayan et al. | 156/345.45 |
| 2002/0157608 A1 * | 10/2002 | Nakano et al. | 118/723 MW |
| 2003/0038112 A1 * | 2/2003 | Liu et al. | 216/60 |
| 2003/0048591 A1 * | 3/2003 | Jann et al. | 361/230 |
| 2005/0178748 A1 * | 8/2005 | Buchberger et al. | 219/121.48 |

FOREIGN PATENT DOCUMENTS

| | | |
|---|---|---|
| JP | 8-037097 | 2/1996 |
| JP | 2002-12977 | 1/2002 |
| JP | 2002-327276 | 11/2002 |

* cited by examiner (a)

(b)

(a)

(b)

HIGH-FREQUENCY POWER SUPPLY STRUCTURE AND PLASMA CVD DEVICE USING THE SAME

TECHNICAL FIELD

The present invention relates to a radio frequency power supply structure and a plasma CVD (chemical vapor deposition) device comprising the same for use in a device or system generating plasma by charging a plate-like electrode with a radio frequency power. This radio frequency power supply structure is able to efficiently supply the electrode with the radio frequency power from an RF cable (radio frequency power cable).

BACKGROUND ART

As a general example of a prior art device generating plasma by charging a plate-like electrode with a radio frequency power, a construction of a plasma CVD device generating plasma to form a silicon film or the like on a target substrate will be described with reference to FIG. 4. Also, a radio frequency power supply structure supplying this electrode with the radio frequency power from an RF cable will be described with reference to FIGS. 5 and 6. FIG. 4 is a schematic constructional view showing one example of a prior art plasma CVD device. FIG. 5 comprises FIG. 5(a) and FIG. 5(b), wherein FIG. 5(a) is a perspective view of a ladder electrode and an RF cable both shown in FIG. 4 and FIG. 5(b) is a side view as seen in the direction of arrow C of FIG. 5(a). FIG. 6 is an enlarged cross sectional view of portion D of FIG. 5(b).

In the plasma CVD device, designated by reference numeral 100 in FIG. 4, plasma is generated by the electrode being charged with the radio frequency power, so that a film of amorphous silicon, microcrystalline silicon, polycrystalline silicon, silicon nitride, etc. to be used for a solar cell, thin-film transistor, etc. is formed on a substrate 5. Recently, there is a large demand for the substrate 5 of a large size and, in order to uniformly apply a silicon film onto the large size substrate, the electrode for the radio frequency power is also constructed in a plate shape and in a large size. As an example thereof, there is provided a ladder electrode 3, as shown in FIGS. 4 and 5. That is, two lateral electrodes 3a forming two mutually opposed end peripheral portions of the electrode of the plate shape are connected to each other via a plurality of longitudinal electrodes 3b so that the ladder electrode 3 formed in a longitudinal grid plate shape is provided.

Herein, while the description of both of the prior art and embodiments of the present invention will be made based on the example using the ladder electrode 3 as a plate-like electrode for the radio frequency power, the present invention is not limited to the case using the ladder electrode 3 but is also applicable to the radio frequency power supply structure using a general radio frequency electrode formed in a plate shape.

In the prior art plasma CVD device 100 exemplified in FIG. 4, the ladder electrode 3 is provided in a vacuum vessel 1. On one side of the ladder electrode 3 in the vacuum vessel 1, an earth electrode 4 is provided and the substrate 5, mentioned above, to which the silicon film is to be applied is arranged on the earth electrode 4. On the other side of the ladder electrode 3, not on the substrate 5 side, a film forming chamber 2 is formed so as to surround the ladder electrode 3. The film forming chamber 2 has its substrate 5 side opened and also has its inner wall surface facing to the ladder electrode 3 fitted with a gas supply portion 6 connected to a gas supply source (not shown). The vacuum vessel 1 comprises an exhaust pipe 16 through which gas is discharged outside. The exhaust pipe 16 is connected to an exhaust device, that is, a vacuum device (not shown).

The lateral electrode 3a comprises a connecting portion 11 to which an RF cable 9 is connected, so that the ladder electrode 3 is supplied with a radio frequency power i from an RF power source (radio frequency power source) 7 via a matching device 8. It is to be noted that the connecting portion 11 is usually provided in the number of plurality in order to evenly supply the ladder electrode 3 of the plate shape with the radio frequency power.

By the radio frequency power supplied to the ladder electrode 3, silane gas ($SiH_4$) supplied from the gas supply portion 6 is changed to plasma in a space 10 between the ladder electrode 3 and the substrate 5 in the vacuum vessel 1 and a film of silicon (Si) is formed on the substrate 5.

Also, if nitrogen trifluoride ($NF_3$) is injected for removing the silicon film deposited on the ladder electrode 3, etc. in the vacuum vessel 1, the radio frequency power supplied to the ladder electrode 3 can be used for changing the nitrogen trifluoride to plasma that can be decomposed as well as for etching the interior of the vacuum vessel 1 by F (fluorine) radical generated by the decomposition. Also, the radio frequency power can otherwise be used for various surface treatments using plasma.

In order to make possible a high-speed film forming or a surface treatment of a high-speed etching or the like, it is necessary to generate a high density plasma and, for this purpose, the electrode is needed to be supplied with the radio frequency power with a high efficiency. However, in the prior art radio frequency power supply structure using the ladder electrode 3, there is a problem as follows.

That is, as shown in FIGS. 5(a) and 5(b), the RF cable 9 is connected to the ladder electrode 3 with a right angle θ relative to a plane formed by the ladder electrode 3 at the connecting portion 11 of the lateral electrode 3a.

Hence, the power i from the RF cable 9 streams into the lateral electrode 3a turning orthogonally at the connecting portion 11. Also, in the case where the longitudinal electrode 3b directly connects to the connecting portion 11, the power i from the RF cable 9 streams into the longitudinal electrode 3b turning orthogonally at the connecting portion 11.

Such radio frequency power supply structure of the connecting portion 11 in the prior art through which the power i streams into the ladder electrode 3 will be described with reference to FIG. 6. In FIG. 6, numeral 9a designates an RF cable core wire, numeral 9b an RF cable outer shell that functions as earth and numeral 9c an insulator portion.

While the power i passes through the interior of the RF cable 9, a voltage acts between the RF cable outer shell 9b and the RF cable core wire 9a so that the power i is stably transmitted therein. But, as the RF cable outer shell 9b is cut off at the connecting portion 11 of the ladder electrode 3 so that the earth is also cut off there, the voltage after the connecting portion 11 acts relative to an arbitrary earth and an electric line of force e becomes unstable there.

Also, as the RF cable 9 connects to the connecting portion 11 orthogonally to the plane formed by the ladder electrode 3, the voltage acting after the connecting portion 11 becomes asymmetric and thereby a distribution of the electric line of force e also becomes asymmetric. Hence, an impedance at the connecting portion 11 becomes largely changeable.

For this reason, a reflection of the radio frequency power arises at the connecting portion 11 and there is caused a problem that an incidence of the radio frequency power i into the ladder electrode 3 is reduced, thereby worsening the efficiency of the film forming and the surface treatment.

Moreover, as the reflection of the power i at the connecting portion 11 is large, if there is an error in setting the connection at the connecting portion 11, there are caused differences in the reflecting power and thereby the incident power is also largely influenced. Hence, in case where the electrode structure has a plurality of the connecting portions 11, there are caused imbalances of the incident power i between each of the plurality of the connecting portions 11. These imbalances cause a non-uniformity of the power in the plane formed by the ladder electrode 3 to worsen the uniformity of plasma thereby generated. Thus, in the prior art, there is a problem to often deteriorate the quality of products on which the film is formed or the surface treatment is carried out.

DISCLOSURE OF THE INVENTION

In order to solve the problems in the prior art radio frequency power supply structure and plasma CVD device comprising the same for use in a device generating plasma by charging a plate-like electrode with a radio frequency power, it is an object of the present invention to provide a radio frequency power supply structure and a plasma CVD device comprising the same in which a reflection of the radio frequency power is reduced at a connecting portion of the electrode to which an RF cable is connected and an incidence of the radio frequency power into the electrode increases.

In order to achieve the above-mentioned object, the present invention provides the following means:

(1) As a first means, a radio frequency power supply structure for use in a device generating plasma by charging a plate-like electrode with a radio frequency power, the radio frequency power supply structure supplying the electrode with the radio frequency power from an RF cable, is characterized in that the RF cable is positioned on an extended plane of a plane formed by the electrode to connect to the electrode at a connecting portion provided on an end peripheral portion of the electrode.

According to the present first means, the RF cable connects to the electrode substantially in the same plane as the plane formed by the electrode so that the voltage acting after the connecting portion becomes symmetric relative to the plane formed by the electrode. Thereby, the distribution of the electric line of force also becomes symmetric. Thus, the change of the impedance at the connecting portion is reduced, the reflection of the radio frequency power at the connecting portion is reduced and the incidence of the radio frequency power into the electrode increases. Also, the reflection of the power at the connecting portion is small and the differences in the reflecting power due to an error in setting the connection become less. Thereby, even in the case where the electrode is constructed having plural connecting portions, the imbalances of the incident power between each of the plural connecting portions hardly occur so that a non-uniformity of the power in the plane formed by the electrode becomes less and a uniformity of the plasma increases.

(2) As a second means, the radio frequency power supply structure as mentioned in the first means is characterized in that the end peripheral portion of the electrode where the connecting portion is provided forms a right angle to the RF cable on the plane formed by the electrode at the connecting portion.

According to the present second means, in addition to the function of the first means, the end peripheral portion of the electrode at the connecting portion forms the right angle to the RF cable. Thereby, the symmetric nature is increased also relative to the plane orthogonal to the plane formed by the electrode at the connecting portion and including the RF cable. Hence, the change of the impedance at the connecting portion is further reduced, the reflection of the radio frequency power at the connecting portion is further reduced and the incidence of the radio frequency power into the electrode further increases.

(3) As a third means, the radio frequency power supply structure as mentioned in the first or second means is characterized in that the electrode forms a longitudinal grid plate shape having two lateral electrodes forming two mutually opposed end peripheral portions of the electrode and a plurality of longitudinal electrodes arranged between the two lateral electrodes so as to connect to the two lateral electrodes.

According to the present third means, the function of the first or second means can be realized by a ladder electrode that is used as an electrode formed in a plate shape and in a large size.

(4) As a fourth means, the radio frequency power supply structure as mentioned in the third means is characterized in that the RF cable is directed in parallel with the plurality of longitudinal electrodes to connect to the electrode at the connecting portion.

According to the present fourth means, in addition to the function of the third means, the RF cable is connected to the electrode being directed in parallel with the plural longitudinal electrodes. Thereby, the symmetric nature is increased also relative to the plane orthogonal to the plane formed by the ladder electrode at the connecting portion and including the RF cable. Hence, the change of the impedance at the connecting portion is further reduced, the reflection of the radio frequency power at the connecting portion is further reduced and the incidence of the radio frequency power into the ladder electrode further increases.

(5) As a fifth means, the radio frequency power supply structure as mentioned in the fourth means is characterized in that the RF cable directly connects to one of the plurality of longitudinal electrodes at the connecting portion.

According to the present fifth means, in addition to the function of the fourth means, the connecting portion coincides with the position of one of the longitudinal electrodes so that the RF cable directly connects to this longitudinal electrode. Thereby, turning of the stream of the radio frequency power is avoided. Further, the symmetric nature is increased also relative to the plane orthogonal to the plane formed by the ladder electrode at the connecting portion and including the RF cable. Hence, the change of the impedance at the connecting portion is further reduced, the reflection of the radio frequency power at the connecting portion is further reduced and the incidence of the radio frequency power into the ladder electrode further increases.

(6) As a sixth means, the radio frequency power supply structure as mentioned in any one of the first to the fifth means is characterized in that a core cable of the RF cable connects to the electrode so as to form a smoothly curved continuous surface at the connecting portion.

According to the present sixth means, in addition to the function of any one of the first to the fifth means, a sudden change of the impedance due to a discontinuous change of the power stream passage can be avoided. Thereby, the reflection of the radio frequency power is further reduced and the incidence of the radio frequency power into the electrode further increases.

(7) As a seventh means, the radio frequency power supply structure as mentioned in any one of the first to the fifth means is characterized in that an outer shell, functioning as earth, of the RF cable has its front end elongated to the position of the electrode at the connecting portion to form an elongated portion that covers the connecting portion.

According to the present seventh means, in addition to the function of any one of the first to the fifth means, a sudden change of the impedance due to a sudden cut of the earth formed by the outer shell of the RF cable can be avoided. Thereby, the reflection of the radio frequency power is further reduced and the incidence of the radio frequency power into the electrode further increases.

(8) As an eighth means, a plasma CVD device comprising the radio frequency power supply structure as mentioned in any one of the first to the seventh means is provided.

According to the present eighth means, the plasma CVD device can exhibit the function of any one of the first to the seventh means. Thus, the ratio of the power inputted into the space between the electrode and the substrate to the radio frequency power transmitted from an RF power source can be increased. Also, a stable radio frequency power can be supplied into the space between the electrode and the substrate and a generation of a uniform plasma distribution in a wide area becomes possible.

BRIEF DESCRIPTION OF THE DRAWINGS

FIG. 1 comprises FIGS. 1(a) and 1(b), wherein FIG. 1(a) is a front view of a ladder electrode and an RF cable of a radio frequency power supply structure of one embodiment according to the present invention and FIG. 1(b) is a side view seen in the direction of arrow A of FIG. 1(a).

FIG. 5 comprises FIGS. 5(a) and 5(b), wherein FIG. 5(a) is a perspective view of a ladder electrode and an RF cable both shown in FIG. 4 and FIG. 5(b) is a side view as seen in the direction of arrow C of FIG. 5(a).

BEST MODE FOR CARRYING OUT THE INVENTION

A radio frequency power supply structure and a plasma CVD device comprising the same of one embodiment according to the present invention will be described with reference to FIGS. 1 to 3.

Figure 1:
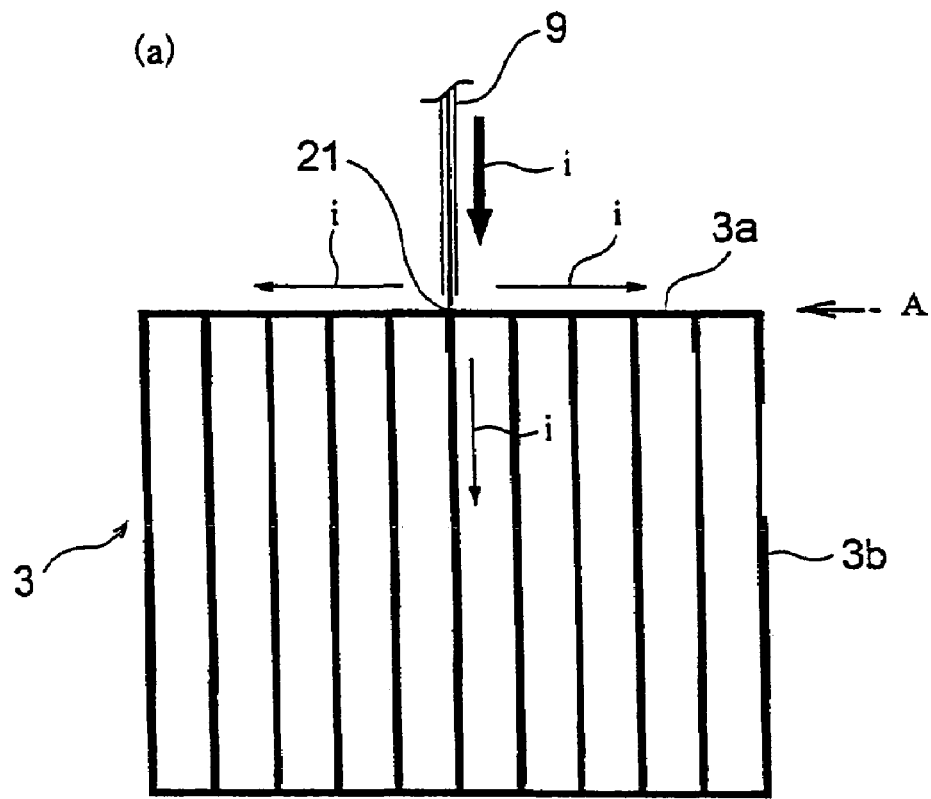
Figure 1:
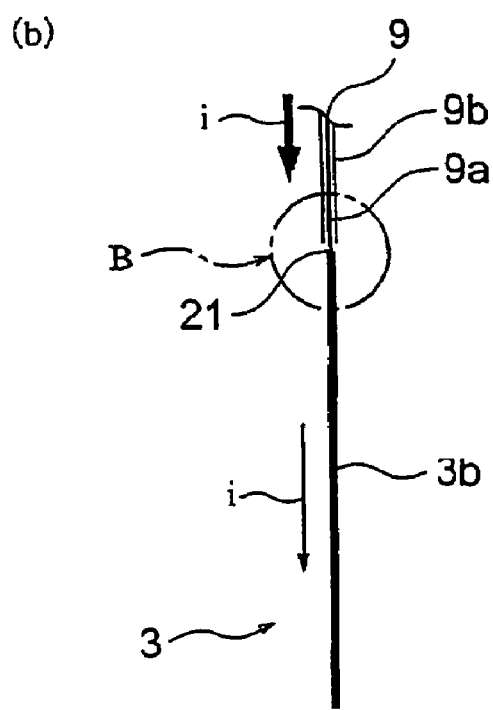

FIG. 1 comprises FIGS. 1(a) and 1(b), wherein FIG. 1(a) is a front view of a ladder electrode and an RF cable of the radio frequency power supply structure of the present embodiment and FIG. 1(b) is a side view seen in the direction of arrow A of FIG. 1(a). FIG. 2 is an enlarged cross sectional view of a connecting portion shown as portion B of FIG. 1(b). FIG. 3 comprises FIGS. 3(a) and 3(b) both being the same enlarged cross sectional views as FIG. 2 showing variations of the connecting portion. It is to be noted that an entire construction of the plasma CVD device comprising the radio frequency power supply structure of the present embodiment is the same as that shown in FIG. 4 and an illustration thereof is omitted.

Figure 5:
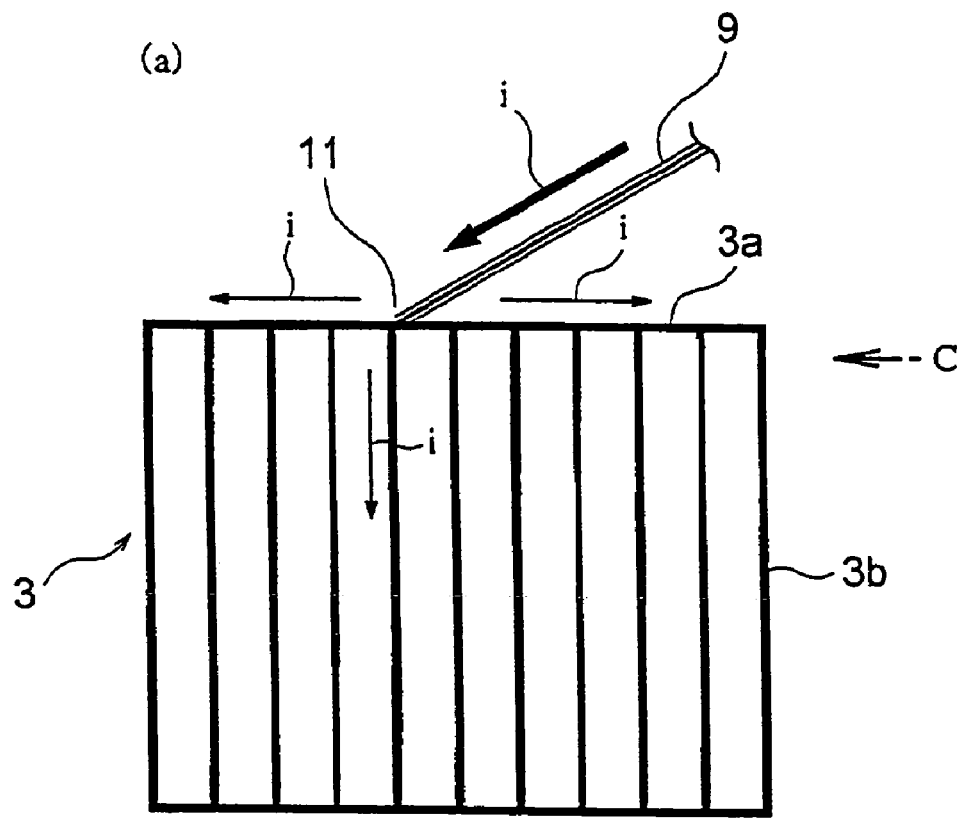
Figure 5:
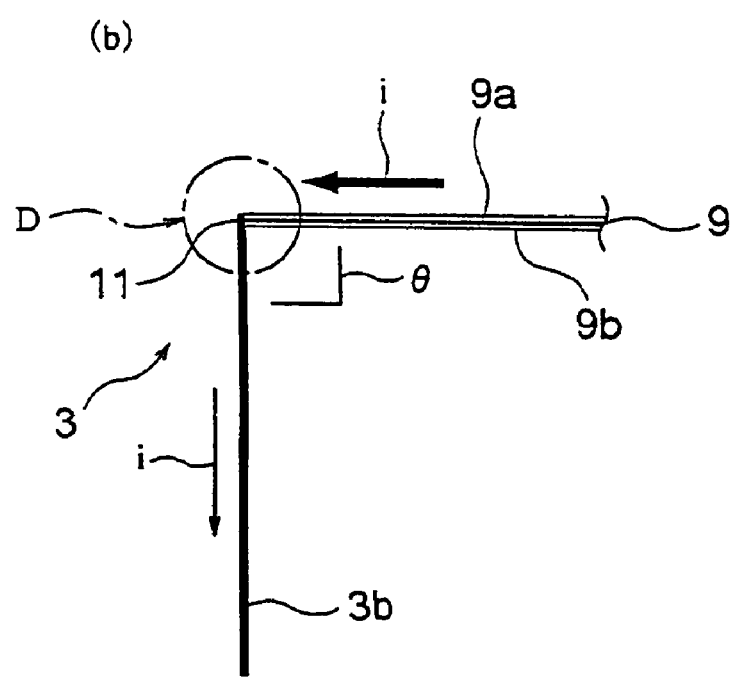
Figure 6:
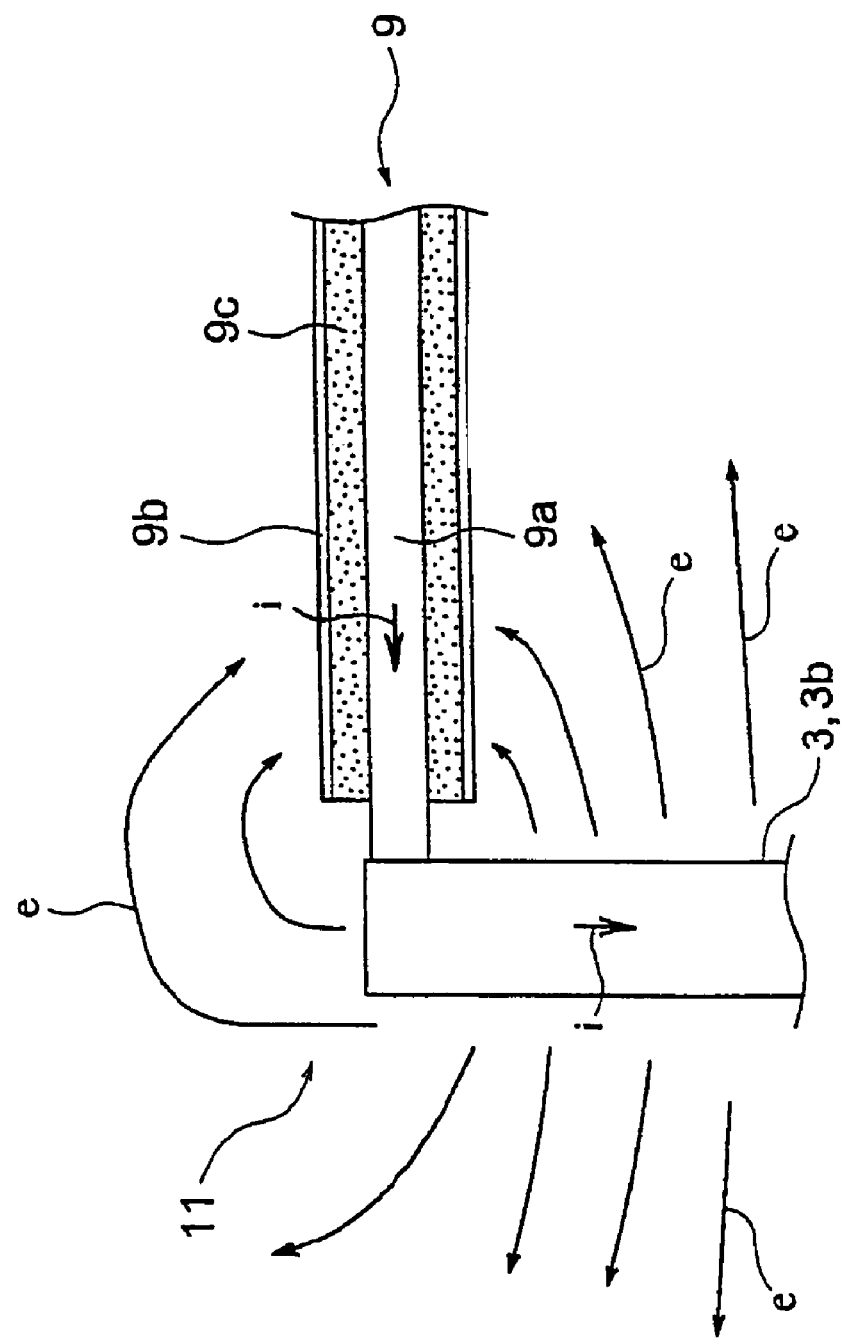
FIG. 6 is an enlarged cross sectional view of portion D of FIG. 5(b).

As seen in FIGS. 1(a) and 1(b), except the structure of the connecting portion 21, the ladder electrode 3 and the RF cable 9 of the present embodiment are of the same construction as the prior art ones shown in FIG. 5. Hence, by the same components being designated with the same reference numerals, description thereof is omitted and different points will be mainly described below.

In the radio frequency power supply structure of the present embodiment shown in FIG. 1, the RF cable 9 is positioned on an extended plane, as defined below, of a plane formed by the ladder electrode 3 and is arranged to be directed in parallel with the longitudinal electrode 3b so that the RF cable 9 connects to the ladder electrode 3 at the connecting portion 21 of the lateral electrode 3a. Also, the connecting portion 21 is positioned to coincide with the position of a connecting portion between the longitudinal electrode 3b and the lateral electrode 3a and thus the RF cable 9 directly connects to the longitudinal electrode 3b. The lateral electrode 3a forming an end peripheral portion of the ladder electrode 3 and comprising the connecting portion 21 is orthogonal to the RF cable 9.

The above-mentioned term "an extended plane" means a plane extended substantially continuously, even if there is a slight inclination, from the plane formed by the ladder electrode 3 and covers an area where a distribution of the electric line of force e at the connecting portion 21 becomes substantially symmetric between one (or a front) surface side and the other (or back) surface side of the extended plane.

Thus, the power i from the RF cable 9 streams into the longitudinal electrode 3b without turning at the connecting portion 21 and, at the same time, streams into the lateral electrode 3a. At the connecting portion 21, as shown in the side view of FIG. 1(b), all the incident power i entering the ladder electrode 3 streams substantially in the same plane as that of the stream of the power i in the RF cable 9.

Figure 2:
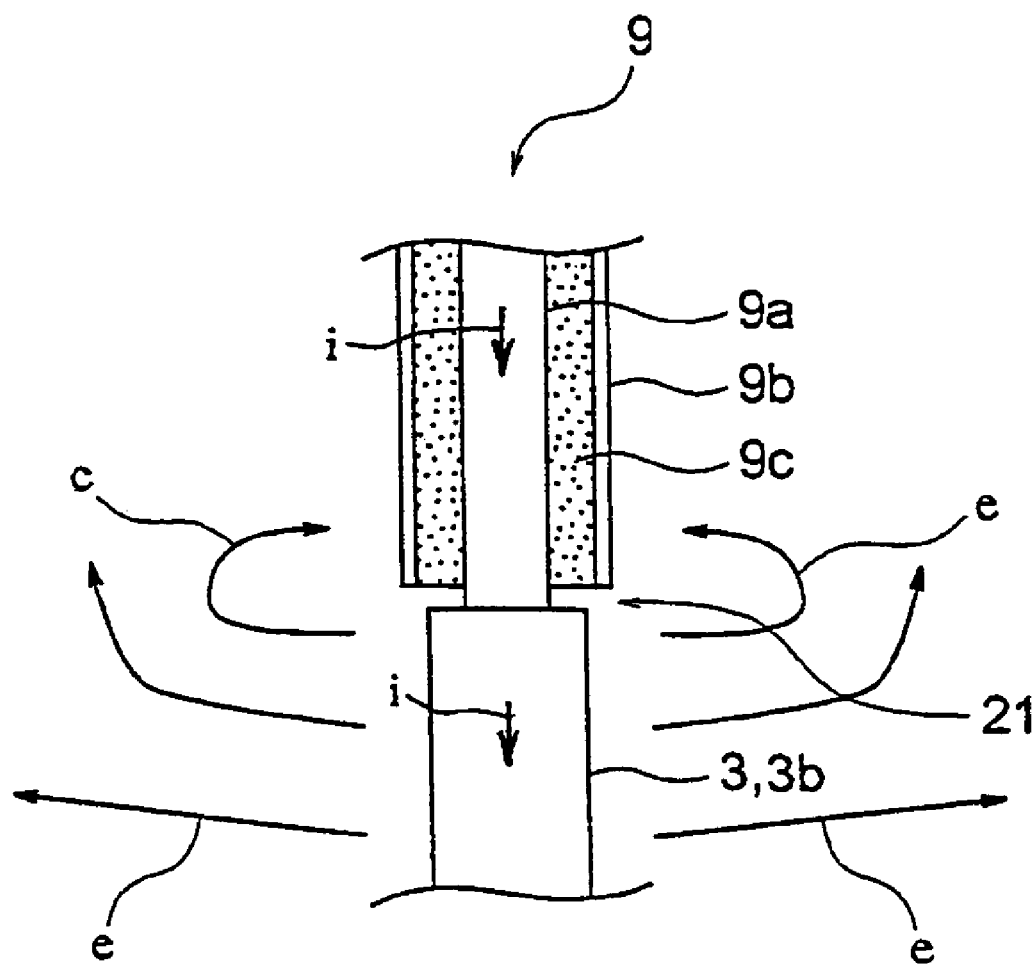
FIG. 2 is an enlarged cross sectional view of a connecting portion shown as portion B of FIG. 1(b).

That is, as shown in FIG. 2 also, at the connecting portion 21 of the present embodiment, as the RF cable 9 connects to the ladder electrode 3 substantially in the same plane as that formed by the ladder electrode 3 and in the direction parallel with the longitudinal electrode 3b, the voltage acting after the connecting portion 21 becomes symmetric relative to the plane formed by the ladder electrode 3 so that the distribution of the electric line of force e also becomes symmetric and the change of the impedance at the connecting portion is largely reduced.

Also, in case the RF cable 9 orthogonally connects to the lateral electrode 3a at the connecting portion 21, the symmetric nature is generated also relative to the plane orthogonal to the plane formed by the ladder electrode 3 at the connecting portion 21 and including the RF cable and thus the change of the impedance at the connecting portion 21 is further reduced.

For this reason, the reflection of the radio frequency power is reduced at the connecting portion 21 to thereby increase the incidence of the radio frequency power i into the ladder electrode 3. Hence, the efficiency of the film forming and the surface treatment can be enhanced.

Moreover, as the reflection of the radio frequency power i is small at the connecting portion 21, the reflecting power caused by an error in setting the connection at the connecting portion 21 becomes less and the influence given by the differences in the reflecting power also becomes less. Hence, even in the electrode structure having a plurality of the connecting portions 21, imbalances in the incident power i are hardly caused between each of the plurality of the connecting portions 21. As the result thereof, a non-uniformity of the power in the plane formed by the ladder electrode 3 is reduced to thereby increase a uniformity of the plasma and the quality of the film forming and the surface treatment can be enhanced.

It is to be noted that if a radio frequency electrode is constructed in a plate shape but not in the shape of the ladder electrode 3, a parallel plate type electrode, for example, can be used and the same effect can be obtained. In case of the parallel plate type electrode, as the plane of the electrode is uniformly formed, it is not essential that the RF cable 9 is arranged to be directed in parallel with the longitudinal electrode 3*b*, as mentioned above. Nevertheless, at the connecting portion 21, the RF cable 9 is to be positioned on the extended plane of the plane formed by the parallel plate type electrode to connect to the parallel plate type electrode. In this case, preferably, the RF cable 9 orthogonally connects to an end periphery of parallel plate type electrode to which the RF cable 9 is connected.

In the case of the ladder electrode 3, it is preferable that the connecting portion 21 coincides with the position of the longitudinal electrode 3*b* so that the RF cable 9 directly connects to the longitudinal electrode 3*b*. Or, if the connecting portion 21 does not coincide therewith, the connecting portion 21 can be positioned near the longitudinal electrode 3*b* and thereby the voltage acting after the connecting portion 21 becomes symmetric at least relative to the plane formed by the ladder electrode 3 so that the distribution of the electric line of force e also becomes symmetric. Hence, the change of the impedance at the connecting portion 21 is reduced and thereby the problems in the prior art can be solved.

Thus, according to the radio frequency power supply structure and the plasma CVD device comprising the same of the present embodiment, the ratio of the radio frequency power inputted into the space 10 between the ladder electrode 3 and the substrate 5 to the radio frequency power transmitted from the RF power source 7 can be increased. Also, a stable radio frequency power can be supplied into the space 10 between the ladder electrode 3 and the substrate 5 and thereby a generation of a uniform plasma distribution (that is, a distribution of plasma characteristic, such as a plasma density, plasma temperature, plasma electric potential, etc.) of a large area becomes possible. Also, a high speed film forming and a surface treatment of high speed etching, etc. of a large area become possible. Hence, the quality of the products to which the film forming or the surface treatment is applied can be enhanced.

Figure 3:
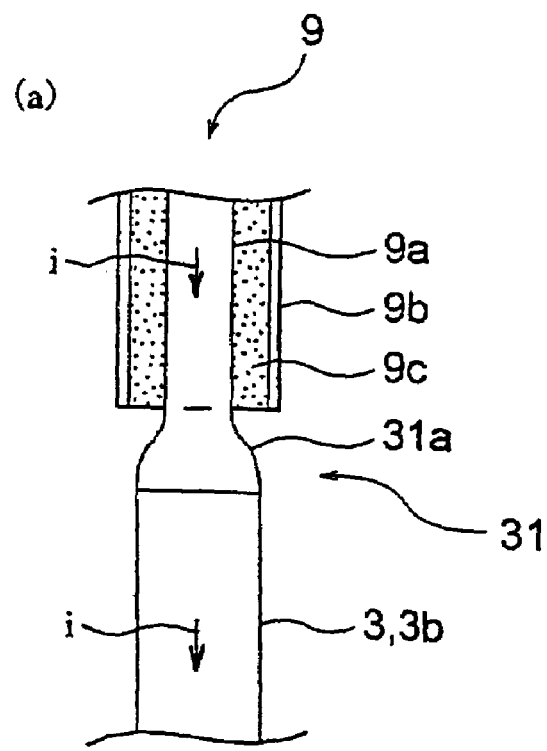
FIG. 3 comprises FIGS. 3(a) and 3(b) both being the same enlarged cross sectional views as FIG. 2 showing variations of the connecting portion.
Figure 3:
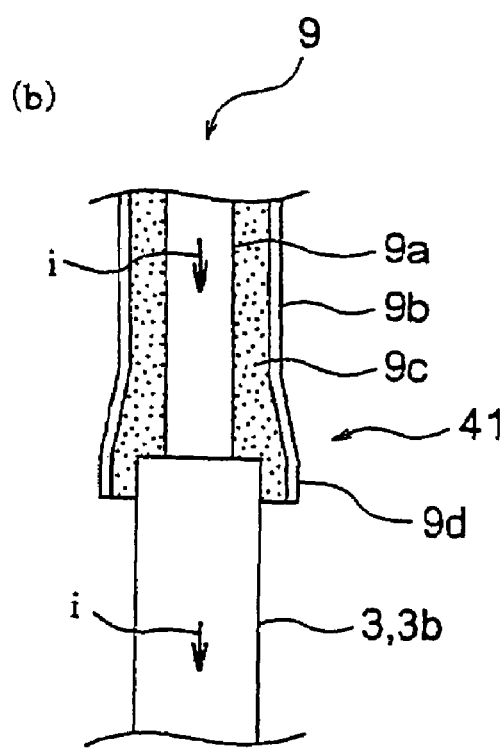
Figure 4:
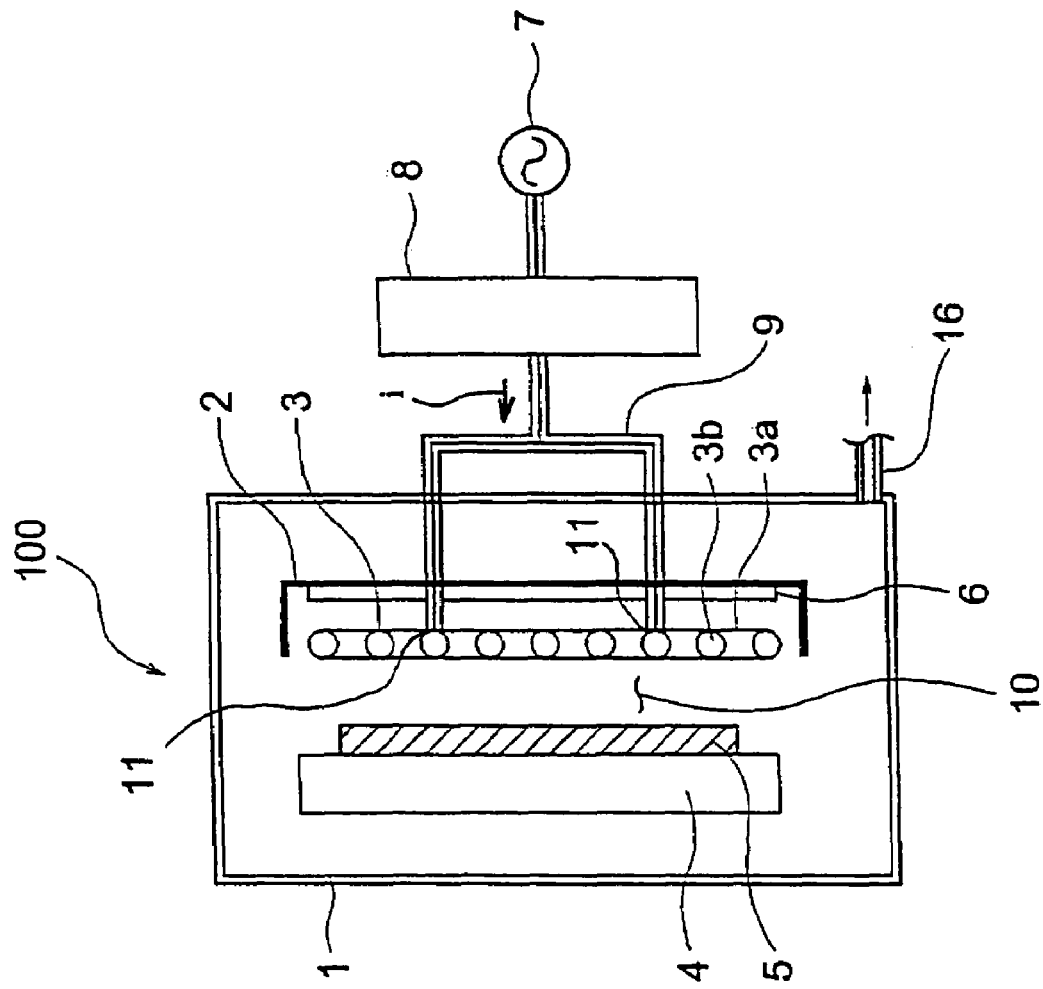
FIG. 4 is a view schematically showing a construction of one example of a prior art plasma CVD device.

In the variation example of the connecting portion shown in FIG. 3(*a*), a connecting portion 31 where the RF cable core wire 9*a* connects to the ladder electrode 3 is formed having a smoothly curved continuous surface 31*a*. Thereby, a sudden change of the impedance due to a discontinuous change of the power stream passage is avoided and the reflection of the radio frequency power can be further reduced.

In the variation example of the connecting portion shown in FIG. 3(*b*), at a connecting portion 41 where the RF cable core wire 9*a* connects to the ladder electrode 3, an end portion of the RF cable outer shell 9*b* is elongated to reach the ladder electrode 3 to thereby form an RF cable outer shell extended portion 9*d* and also the insulator portion 9*c* is likewise elongated. Thereby, the connecting portion 41 is covered by the insulator portion 9*d* so as to avoid a sudden change of the impedance that would be caused by a sudden cut-off of the earth, if the RF cable outer shell 9*b* is not elongated, and the reflection of the radio frequency power can be further reduced.

While the present invention has been described based on the embodiment, the invention is not limited thereto but, needless to mention, the concrete structure of the present invention may be added with various modifications within the scope of the invention as defined by the appended claims.

For example, while the electrode has been described based on the example of the ladder electrode 3, if the electrode is a radio frequency power electrode constructed in a plate shape, that is, for example, a parallel plate type electrode, the present invention can be likewise applied thereto.

INDUSTRIAL APPLICABILITY (1) According to the invention of claim 1, the radio frequency power supply structure for use in a device generating plasma by charging a plate-like electrode with a radio frequency power, the radio frequency power supply structure supplying the electrode with the radio frequency power from an RF cable, is constructed such the RF cable is positioned on an extended plane of a plane formed by the electrode to connect to the electrode at a connecting portion provided on an end peripheral portion of the electrode. By the fact that the RF cable connects to the electrode substantially in the same plane as the plane formed by the electrode, the voltage acting after the connecting portion becomes symmetric relative to the plane formed by the electrode and the distribution of the electric line of force also becomes symmetric. Thus, the change of the impedance at the connecting portion is reduced, the reflection of the radio frequency power at the connecting portion is reduced and the incidence of the radio frequency power into the electrode increases. Also, the reflection of the power at the connecting portion is small and the differences in the reflecting power due to an error in setting the connection become less. Thereby, even in the case where the electrode is constructed having plural connecting portions, the imbalances of the incident power between each of the plural connecting portions hardly occur so that a non-uniformity of the power in the plane formed by the electrode becomes less and a uniformity of the plasma increases. Hence, the quality of products to which the film forming and the surface treatment are applied can be enhanced.

(2) According to the invention of claim 2, the radio frequency power supply structure as claimed in claim 1 is constructed such that the end peripheral portion of the electrode where the connecting portion is provided forms a right angle to the RF cable on the plane formed by the electrode at the connecting portion. By the fact that the end peripheral portion of the electrode at the connecting portion forms the right angle to the RF cable, in addition to the effect of the invention of claim 1, the symmetric nature is increased also relative to the plane orthogonal to the plane formed by the electrode at the connecting portion and including the RF cable. Hence, the change of the impedance at the connecting portion is further reduced, the reflection of the radio frequency power at the connecting portion is further reduced and the incidence of the radio frequency power into the electrode further increases.

(3) According to the invention of claim 3, the radio frequency power supply structure as claimed in claim 1 or 2 is constructed such that the electrode forms a longitudinal grid plate shape having two lateral electrodes forming two mutually opposed end peripheral portions of the electrode and a plurality of longitudinal electrodes arranged between the two lateral electrodes so as to connect to the two lateral electrodes. Thereby, the effect of the invention of claim 1 or 2 can be realized by a ladder electrode that is used as an electrode formed in a plate shape and in a large size.

(4) According to the invention of claim 4, the radio frequency power supply structure as claimed in claim 3 is constructed such that the RF cable is directed in parallel with the plurality of longitudinal electrodes to connect to the electrode at the connecting portion. By the fact that the RF cable is connected to the electrode being directed in parallel with the plural longitudinal electrodes, in addition to the effect of the invention of claim 3, the symmetric nature is increased also relative to the plane orthogonal to the plane formed by the ladder electrode at the connecting portion and including the RF cable. Hence, the change of the impedance at the connecting portion is further reduced, the reflection of the radio frequency power at the connecting portion is further reduced and the incidence of the radio frequency power into the ladder electrode further increases.

(5) According to the invention of claim 5, the radio frequency power supply structure as claimed in claim 4 is constructed such that the RF cable directly connects to one of the plurality of longitudinal electrodes at the connecting portion. By the fact that the connecting portion coincides with the position of one of the longitudinal electrodes so that the RF cable directly connects to this longitudinal electrode, in addition to the effect of the invention of claim 4, turning of the stream of the radio frequency power is avoided and the symmetric nature is increased also relative to the plane orthogonal to the plane formed by the ladder electrode at the connecting portion and including the RF cable. Hence, the change of the impedance at the connecting portion is further reduced, the reflection of the radio frequency power at the connecting portion is further reduced and the incidence of the radio frequency power into the ladder electrode further increases.

(6) According to the invention of claim 6, the radio frequency power supply structure as claimed in any one of claims 1 to 5 is constructed such that a core cable of the RF cable connects to the electrode so as to form a smoothly curved continuous surface at the connecting portion. By the fact that a sudden change of the impedance due to a discontinuous change of the power stream passage can be avoided, in addition to the effect of the invention of any one of claims 1 to 5, the reflection of the radio frequency power is further reduced and the incidence of the radio frequency power into the electrode further increases.

(7) According to the invention of claim 7, the radio frequency power supply structure as claimed in any one of claims 1 to 5 is constructed such that an outer shell, functioning as earth, of the RF cable has its front end elongated to the position of the electrode at the connecting portion to form an elongated portion that covers the connecting portion. By the fact that a sudden cut of the earth formed by the outer shell of the RF cable can be avoided, in addition to the effect of the invention of any one of claims 1 to 5, the reflection of the radio frequency power is further reduced and the incidence of the radio frequency power into the electrode further increases.

(8) According to the invention of claim 8, a plasma CVD device is constructed to comprise the radio frequency power supply structure as claimed in any one of claims 1 to 7. Thereby, the plasma CVD device can exhibit the effect of any one of claims 1 to 7. Thus, the ratio of the power inputted into the space between the electrode and the substrate to the radio frequency power transmitted from an RF power source can be increased. Also, a stable radio frequency power can be supplied into the space between the electrode and the substrate and a generation of a uniform plasma distribution in a wide area becomes possible. Hence, a high speed and large size film forming and surface treatment of etching or the like become possible and the quality of products to which the film forming and the surface treatment are applied can be enhanced.

What is claimed is:

1. A radio frequency power supply structure for use in a device generating plasma by charging a plate-like electrode, facing an earth electrode, with a radio frequency power, said radio frequency power supply structure supplying said plate-like electrode with the radio frequency power from an RF cable, wherein said RF cable is positioned on an extended plane of a plane formed by said plate-like electrode to connect to said plate-like electrodes, a core cable of said RF cable has an end portion curved to match a connecting width of said plate-like electrode so as to form a smoothly curved continuous surface at a connecting portion provided between the curved end portion of the core cable of said RF cable and said plate-like electrode, on an end peripheral portion of said plate-like electrode, and said plate-like electrode forms a longitudinal grid plate shape facing said earth electrode having two lateral electrodes forming two mutually opposed end peripheral portions of said plate-like electrode, and a plurality of longitudinal electrodes arranged between said two lateral electrodes so as to connect to said two lateral electrodes.

2. A radio frequency power supply structure as claimed in claim 1, wherein the end peripheral portion of said plate-like electrode where said connecting portion is provided forms a right angle to said RF cable on said plane formed by said plate-like electrode at said connecting portion.

3. A radio frequency power supply structure as claimed in claim 1, wherein said RF cable is directed in parallel with said plurality of longitudinal electrodes to connect to said plate-like electrode at said connecting portion.

4. A radio frequency power supply structure as claimed in claim 3, wherein said RF cable directly connects to one of said plurality of longitudinal electrodes at said connecting portion.

5. A radio frequency power supply structure as claimed in claim 1, wherein an outer shell, functioning as earth, of said RF cable has a front end elongated to the position of said plate-like electrode at said connecting portion to form an elongated portion that covers said connecting portion.

6. A plasma CVD device comprising a radio frequency power supply structure as claimed in any one of claims 1, 2, 3, 4, and 5.

* * * * *